United States Patent
Utsunomiya et al.

(10) Patent No.: US 9,819,372 B2
(45) Date of Patent: Nov. 14, 2017

(54) RADIO COMMUNICATION DEVICE AND BURST DISTORTION CORRECTING METHOD

(71) Applicant: FUJITSU LIMITED, Kawasaki-shi, Kanagawa (JP)

(72) Inventors: Yuichi Utsunomiya, Kawasaki (JP); Daisuke Ogawa, Yokosuka (JP); Hiroyoshi Ishikawa, Kawasaki (JP); Kazuo Nagatani, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/238,399

(22) Filed: Aug. 16, 2016

(65) Prior Publication Data

US 2017/0063406 A1    Mar. 2, 2017

(30) Foreign Application Priority Data

Sep. 1, 2015    (JP) .................................. 2015-172336

(51) Int. Cl.
*H03D 1/04*    (2006.01)
*H04L 25/08*    (2006.01)
(Continued)

(52) U.S. Cl.
CPC ......... *H04B 1/0475* (2013.01); *H03F 1/3247* (2013.01); *H03F 1/3258* (2013.01);
(Continued)

(58) Field of Classification Search
USPC ............... 375/219, 220, 221, 146, 147, 240, 375/240.26, 240.27, 254, 257, 258, 25, 6,
(Continued)

(56) References Cited

U.S. PATENT DOCUMENTS

| | | | | |
|---|---|---|---|---|
| 8,451,055 B2* | 5/2013 | Fudaba | ................. | H03F 1/3247 330/149 |
| 8,509,349 B2* | 8/2013 | Nagatani | ............... | H03F 1/3247 375/295 |
| 2002/0191710 A1* | 12/2002 | Jeckeln | ................. | H03F 1/3247 375/296 |
| 2006/0221808 A1* | 10/2006 | Shirakata | ............. | H04B 7/0848 370/203 |

(Continued)

FOREIGN PATENT DOCUMENTS

| | | |
|---|---|---|
| JP | 2001-060883 | 3/2001 |
| WO | 2008120318 | 10/2008 |
| WO | 2008126217 | 10/2008 |

*Primary Examiner* — Linda Wong
(74) *Attorney, Agent, or Firm* — Fujitsu Patent Center

(57) ABSTRACT

A radio communication device includes: an instantaneous coefficient acquisition unit that acquires an instantaneous coefficient that corrects an instantaneous change contained in a burst distortion corresponding to an elapsed time from a top of a burst signal in which a constant power level continues and instantaneously changes the power level of the burst signal; an average coefficient acquisition unit that acquires an average coefficient that corrects an average change contained in the burst distortion and gradually changes the power level of the burst signal from the top to an end of the burst signal; a synthesizer that synthesizes the instantaneous coefficient acquired by the instantaneous coefficient acquisition unit with the average coefficient acquired by the average coefficient acquisition unit; and a corrector that uses a correction coefficient obtained from the synthesizing by the synthesizer to correct the burst distortion occurring in the burst signal.

13 Claims, 11 Drawing Sheets

(51) Int. Cl.
  *H04B 15/00* (2006.01)
  *H04B 1/04* (2006.01)
  *H03F 1/32* (2006.01)
  *H03F 3/24* (2006.01)
  *H03F 3/19* (2006.01)
  *H04L 5/14* (2006.01)
  *H04L 27/36* (2006.01)

(52) U.S. Cl.
  CPC ............... *H03F 3/19* (2013.01); *H03F 3/245* (2013.01); *H04B 2001/0416* (2013.01); *H04B 2001/0425* (2013.01); *H04L 5/14* (2013.01); *H04L 27/368* (2013.01)

(58) Field of Classification Search
  USPC ....... 375/284, 285, 297, 296, 300, 316, 318, 375/320, 324, 340, 346
  See application file for complete search history.

(56) References Cited

U.S. PATENT DOCUMENTS

| | | | |
|---|---|---|---|
| 2008/0095264 A1* | 4/2008 | Deng | H03F 1/3247 375/296 |
| 2010/0014609 A1* | 1/2010 | Ishikawa | H03F 1/3247 375/297 |
| 2010/0062733 A1 | 3/2010 | Ishikawa et al. | |
| 2013/0083866 A1* | 4/2013 | Masunaga | H04B 1/0475 375/297 |
| 2015/0077179 A1* | 3/2015 | Matsubara | H03F 3/24 330/149 |
| 2016/0028421 A1* | 1/2016 | Kakinuma | H04B 1/0475 375/296 |
| 2016/0036472 A1* | 2/2016 | Chang | H04B 1/0475 375/297 |

* cited by examiner

RADIO COMMUNICATION DEVICE AND BURST DISTORTION CORRECTING METHOD

CROSS-REFERENCE TO RELATED APPLICATION

This application is based upon and claims the benefit of priority of the prior Japanese Patent Application No. 2015-172336, filed on Sep. 1, 2015, the entire contents of which are incorporated herein by reference.

FIELD

The embodiments discussed herein are related to a radio communication device and a burst distortion correcting method.

BACKGROUND

A transmission device in a radio communication system is generally provided with a power amplifier that amplifies a transmission signal. When the power of an input signal is relatively small, the power amplifier linearly amplifies the input signal and accordingly the linearity between the input power and the output power can be maintained. On the other hand, when the power of an input signal is relatively large, the saturation area of input/output characteristics is reached and the linearity between the input power and the output power collapses. For this reason, when the power amplifier is caused to run at the saturation area that is generally efficient, a non-linear distortion occurs in the transmission signal that is amplified by the power amplifier. The non-linear distortion can be a cause of an increase in adjacent channel leakage ratio (ACLR) and therefore it is preferable to reduce the non-linear distortion.

The transmission device may employ a distortion compensation technique using the pre-distortion system that compensates the non-linear distortion by adding in advance a distortion having characteristic inverse to those of the non-linear distortion that occurs in the power amplifier. The distortion that is added in advance to the transmission signal in the pre-distortion system is also referred to as a distortion compensation coefficient. For example, a distortion compensation coefficient corresponding to the power level of the transmission signal is read from a lookup table and the transmission signal is multiplied by the distortion compensation coefficient. When the transmission signal that is multiplied by the distortion compensation coefficient is amplified by the power amplifier, a non-linear distortion that occurs in the power amplifier offsets the distortion from the distortion compensation coefficient and accordingly the distortion of the transmission signal is reduced.

Distortions that occur in transmission signals include, in addition to non-linear distortions that occur in power amplifiers, burst distortions that occur in burst signals that are transmitted in time division duplex (TDD) communications. In a burst distortion, the power increases at a rise of a burst signal and the power decreases as the time elapses. Specifically, when transmission of a burst signal is started, the power amplifier starts running and warms up rapidly and accordingly the power of the burst signal increases significantly in few tens of to hundreds of nano seconds (ns) after the start of the transmission. Once few tens of to hundreds of nano seconds after the start of the transmission elapses, the entire power amplifier warms up and the gain decreases gradually and accordingly the power of the burst signal decreases gradually. Similarly to the case of non-linear distortion, examinations have been made on reducing a burst distortion that changes, as described above, the power of a burst signal by adding a correction coefficient having characteristics inverse to the burst distortion to a transmission signal.

Patent Document 1: International Publication Pamphlet No. WO 2008/120318
Patent Document 2: International Publication Pamphlet No. WO 2008/126217

The burst distortion however contains, in addition to an average change that gradually reduces the power from the top to the end of the burst signal, an instantaneous change that changes an instantaneous power of the burst signal in a shorter period. Furthermore, there is a problem in that only reducing the average change corresponding to the elapsed time from the top of the burst signal leaves the instantaneous change and thus it is not possible to correct the burst distortion sufficiently.

In other words, while the average change that gradually reduces the power of the burst signal is observed when the burst signal is viewed macroscopically from the top to the end, the instantaneous change that changes the power of the burst signal instantaneously is observed when the burst signal is viewed microscopically. In order to improve the quality of the burst signal, it is preferable that the burst distortion including not only the average change but also the instantaneous change be corrected.

SUMMARY

According to an aspect of an embodiment, a radio communication device includes: an instantaneous coefficient acquisition unit that acquires an instantaneous coefficient that corrects an instantaneous change contained in a burst distortion corresponding to an elapsed time from a top of a burst signal in which a constant power level continues and instantaneously changes the power level of the burst signal; an average coefficient acquisition unit that acquires an average coefficient that corrects an average change contained in the burst distortion and gradually changes the power level of the burst signal from the top to an end of the burst signal; a synthesizer that synthesizes the instantaneous coefficient acquired by the instantaneous coefficient acquisition unit with the average coefficient acquired by the average coefficient acquisition unit; and a corrector that uses a correction coefficient obtained from the synthesizing by the synthesizer to correct the burst distortion occurring in the burst signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to accompanying drawings. The following embodiments are not to be construed as limiting the invention.

[a] First Embodiment

Figure 1:
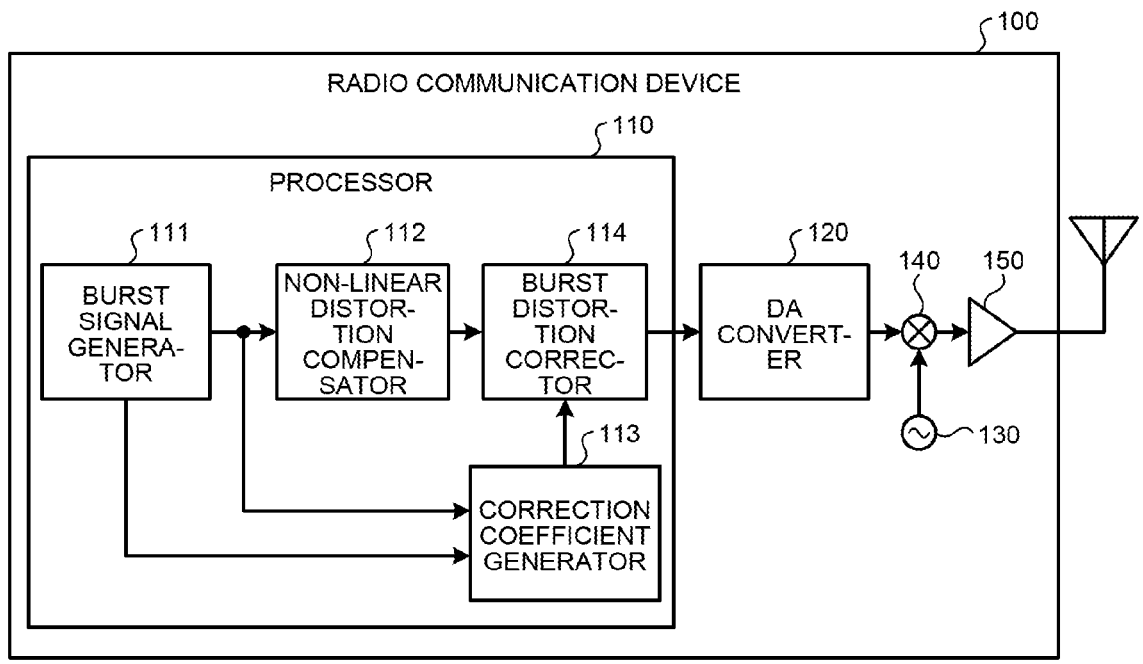
FIG. 1 is a block diagram of a configuration of a radio communication device according to a first embodiment.

FIG. 1 is a block diagram of a configuration of a radio communication device 100 according to a first embodiment. The radio communication device 100 includes a processor 110, a digital analog (DA) converter 120, an oscillator 130, a mixer 140, and a power amplifier 150.

The processor 110 includes, for example, a central processing unit (CPU), a field programmable gate array (FPGA) or a digital processing unit (DSP). The processor 110 generates a burst signal and corrects a burst distortion that occurs in the burst signal. Specifically, the processor 110 includes a burst signal generator 111, a non-linear distortion compensator 112, a correction coefficient generator 113, and a burst distortion corrector 114. Each of the processing units may be configured of hardware or software.

The burst signal generator 111 generates a burst signal containing transmission data. The burst signal is a signal in which a constant power level continues for a given time. Burst signals are transmitted intermittently in, for example, TDD communication. The burst signal generator 111 sends the generated burst signal to the non-linear distortion compensator 112 and the correction coefficient generator 113. The burst signal generator 111 outputs timing information representing a timing for generating a burst signal to the correction coefficient generator 113. In other words, because burst signals are transmitted intermittently, the burst signal generator 111 outputs information on a timing at which sending a burst signal is to be started to the correction coefficient generator 113.

The non-linear distortion compensator 112 compensates a non-linear distortion that occurs in the power amplifier 150 by using the pre-distortion system. In other words, the non-linear distortion compensator 112 adds a distortion compensation coefficient having characteristics inverse to those of a non-linear distortion that occurs in the power amplifier 150 to the burst signal. Although it is not illustrated in FIG. 1, the output of the power amplifier 150 may be sent as a feedback signal to the non-linear distortion compensator 112 and the non-linear distortion compensator 112 may update the distortion compensation coefficient so as to reduce the non-linear distortion remaining in the feedback signal.

The correction coefficient generator 113 generates a correction coefficient for correcting the burst distortion. The correction coefficient generator 113 generates an average coefficient that corrects an average change that gradually decreases from the top to the end of the burst signal and an instantaneous coefficient that corrects an instantaneous change that changes the power of the burst signal instantaneously and then generates a correction coefficient by synthesizing the average coefficient with the instantaneous coefficient. Specific processing performed by the correction coefficient generator 113 will be described in detail below.

The burst distortion corrector 114 corrects a burst distortion by multiplying the burst signal whose non-linear distortion is compensated by the non-linear distortion compensator 112 or by adding the correction coefficient to the burst signal. According to FIG. 1, the burst distortion corrector 114 corrects the burst distortion after the non-linear distortion compensator 112 compensates the non-linear distortion; however, the positions of the non-linear distortion compensator 112 and the burst distortion corrector 114 can be switched each other. In other words, the non-linear distortion compensator 112 may compensates the non-linear distortion after the burst distortion corrector 114 corrects the burst distortion.

The DA converter 120 performs DA conversion on a burst signal that is output from the processor 110 and outputs the resultant analog signal to the mixer 140.

The oscillator 130 generates a local signal having a given frequency. Specifically, the oscillator 130 generates a local signal for interchanging a baseband frequency and a radio frequency and outputs the local signal to the mixer 140.

The mixer 140 uses the local signal that is generated by the oscillator 130 to up-convert the analog signal having the baseband frequency that is output from the DA converter 120. The mixer 140 then outputs the resultant radio signal to the power amplifier 150.

The power amplifier 150 amplifiers the radio signal that is output from the mixer 140 and transmits the amplified radio signal via an antenna. At the transmission, a non-linear distortion and a burst distortion occurs in the power amplifier 150; however, the non-linear distortion and the burst distortion are offset because the non-linear distortion compensator 112 performs the distortion compensation and the burst distortion corrector 114 corrects the burst distortion.

Figure 2:
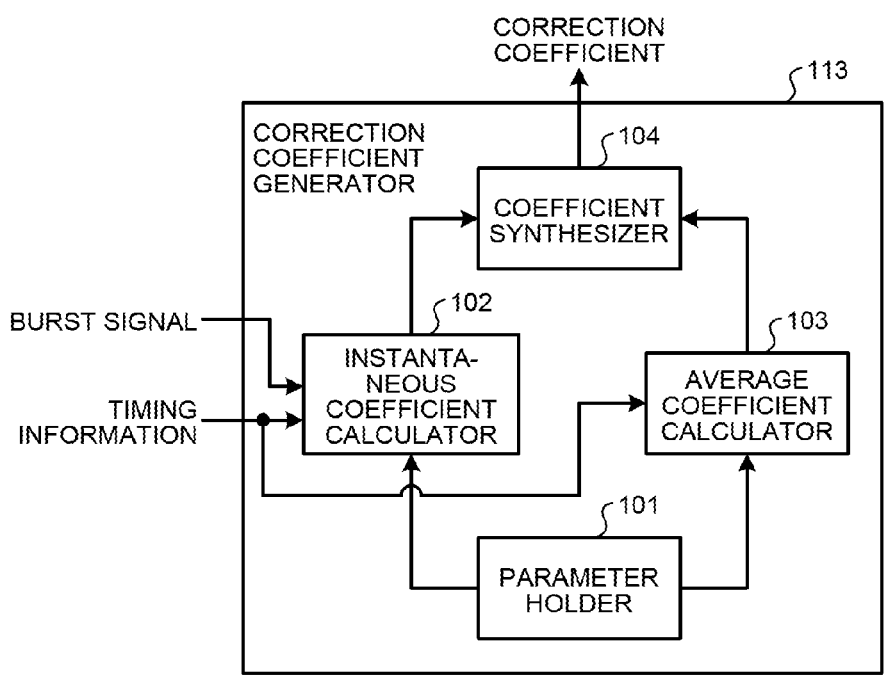
FIG. 2 is a block diagram of a configuration of a correction coefficient generator according to the first embodiment.

The detailed configuration of the correction coefficient generator 113 will be described with reference to FIG. 2. FIG. 2 is a block diagram of a configuration of the correction coefficient generator 113 according to the first embodiment. The correction coefficient generator 113 represented in FIG. 2 includes a parameter holder 101, an instantaneous coefficient calculator 102, an average coefficient calculator 103, and a coefficient synthesizer 104.

The parameter holder 101 holds a parameter for calculating an instantaneous coefficient having characteristics inverse to those of the instantaneous change among the burst distortion and a parameter for calculating an average coefficient having characteristics inverse to those of the average change among the burst distortion. In other words, the parameter holder 101 holds the parameters contained in arithmetic expressions for calculating an instantaneous coefficient and an average coefficient.

The instantaneous coefficient calculator 102 stores the arithmetic expression for calculating an instantaneous coefficient. Upon detecting that sending a burst signal is to be started from the timing information that is output from the burst signal generator 111, the instantaneous coefficient calculator 102 calculates an instantaneous coefficient by using the arithmetic expression. The instantaneous coefficient calculator 102 calculates an instantaneous coefficient by assigning the amplitude of the burst signal to the arithmetic expression using the parameter held by the parameter holder 101. Specifically, the instantaneous coefficient calculator 102 calculates an instantaneous coefficient $C_I$ according to, for example, the following Expression (1):

$$C_I = d \cdot \log|x| \tag{1}$$

Note that, in Expression (1), d is the parameter held by the parameter holder 101 and x is the amplitude of the burst signal The average coefficient calculator 103 stores the arithmetic expression for calculating an average coefficient. Upon detecting that sending a burst signal is to be started from the timing information that is output from the burst signal generator 111, the average coefficient calculator 103 calculates an average coefficient by using the arithmetic expression. The average coefficient calculator 103 calculates an average coefficient by assigning the elapsed time from the start of sending the burst signal to the arithmetic expression using the parameter held by the parameter holder 101. Specifically, the average coefficient calculator 103 calculates an average coefficient $C_A$ according to, for example, the following Expression (2):

$$C_A = at^2 + bt + c \tag{2}$$

Note that a, b and c are the parameters held by the parameter holder 101 and t is the elapsed time from the start of sending the burst signal.

The coefficient synthesizer 104 synthesizes the instantaneous coefficient that is calculated by the instantaneous coefficient calculator 102 with the average coefficient that is calculated by the average coefficient calculator 103 to generate a correction coefficient for correcting the burst distortion containing the instantaneous change and the average change. The coefficient synthesizer 104 outputs the generated correction coefficient to the burst distortion corrector 114.

Figure 3:
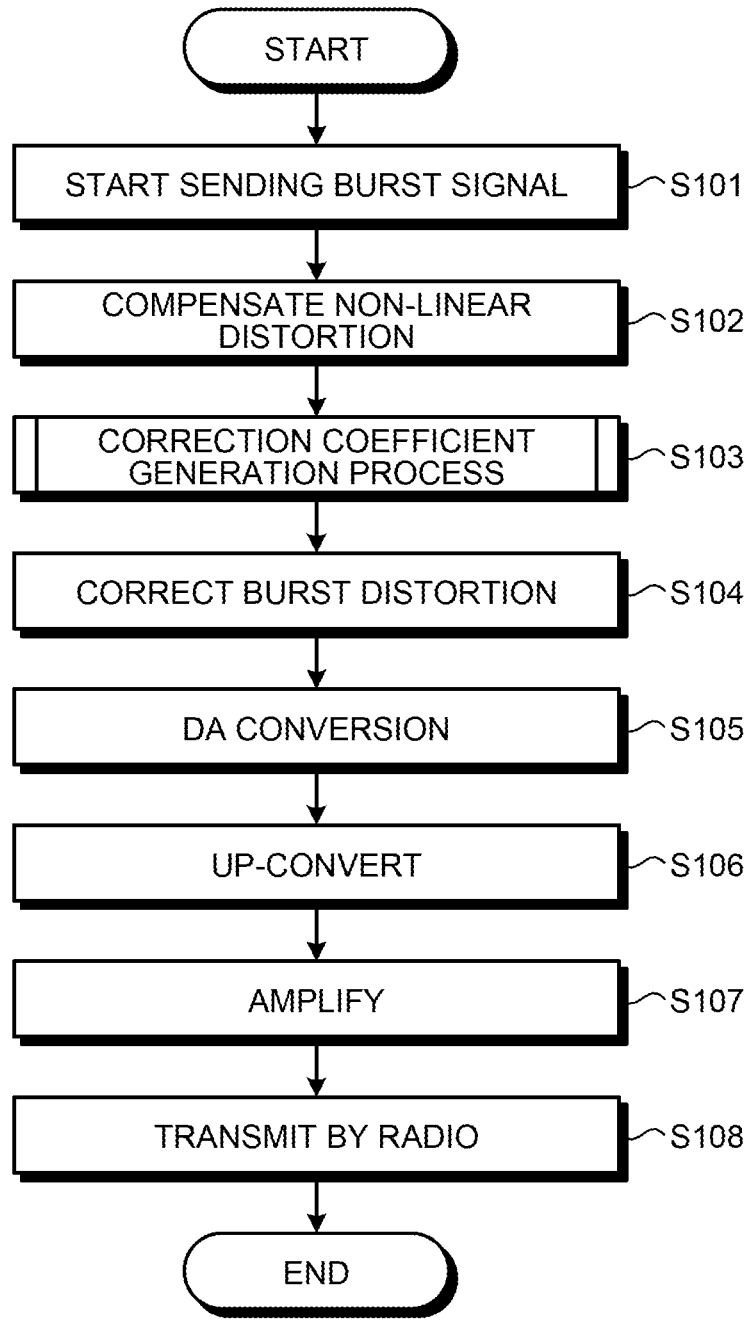
FIG. 3 is a flowchart of a radio transmission process according to the first embodiment.

The radio transmission process performed by the radio communication device 100 having the above-described configuration will be described here with reference to the flowchart represented by FIG. 3.

The radio communication device 100 intermittently transmits burst signals and, when the timing for transmitting a burst signal comes, the burst signal generator 111 generates a burst signal and sends the burst signal to the non-linear distortion compensator 112 and the correction coefficient generator 113 (step S101). The instantaneous coefficient calculator 102 and the average coefficient calculator 103 are notified of the timing for transmitting a burst signal by the timing information that is output from the burst signal generator 111.

Once the burst signal is sent to the non-linear distortion compensator 112, the distortion compensation coefficient is added to the burst signal to compensate the non-linear distortion that occurs in the power amplifier 150 (step S102). In other words, the distortion compensation coefficient having characteristics inverse to those of the non-linear distortion that occurs in the power amplifier 150 is added to the burst signal.

On the other hand, once the burst signal is sent to the correction coefficient generator 113, a correction coefficient for correcting the burst distortion is generated (step S103). The correction coefficient generator 113 calculates an instantaneous coefficient and an average coefficient separately and the calculated two coefficients are synthesized to generate a correction coefficient. The correction coefficient generation process will be described in detail below.

Once the correction coefficient is generated, the burst distortion corrector 114 corrects the burst distortion of the burst signal after compensation of the non-linear distortion (step S104). Specifically, the burst distortion corrector 114 corrects the burst distortion by multiplying the burst signal by the correction coefficient or adding the correction coefficient to the burst signal. Because the correction coefficient that is generated by the correction coefficient generator 113 is the synthesis of the instantaneous coefficient and the average coefficient, correcting the burst distortion by using the correction coefficient enables reduction in both the instantaneous change and the average change contained in the burst distortion. In other words, not only the average change that gradually decreases from the top to the end of the burst signal but also the instantaneous change that instantaneously changes the power of the burst signal are corrected, which enables sufficient correction of the burst distortion.

The non-linear distortion compensation performed by the non-linear distortion compensator 112 (step S102), the correction coefficient generation process performed by the correction coefficient generator 113 (step S103), and the correction of the burst distortion performed by the burst distortion corrector 114 (step S104) are not necessarily performed in the order in which they appear in this sentence. In other words, for example, step S102 and step S103 may be performed at a time and step S102 may be performed after steps S103 and S104.

DA conversion is performed by the DA converter 120 on the burst signal whose burst distortion is compensated (step S105). The burst signal after converted into an analog signal is up-converted by the mixer 140 into a radio signal having a radio frequency (step S106). The radio signal is amplified by the power amplifier 150 (step S107) and is transmitted by radio from the antenna (step S108). In the power amplifier 150, the non-linear distortion and the burst distortion occur; however, the burst signal is added in advance with the distortion compensation coefficient and the correction coefficient and accordingly the non-linear distortion and the burst distortion are offset. As a result, the radio signal that is transmitted by radio is the signal having the reduced non-linear distortion and burst distortion, which enables a reduction in ACLR.

Figure 4:
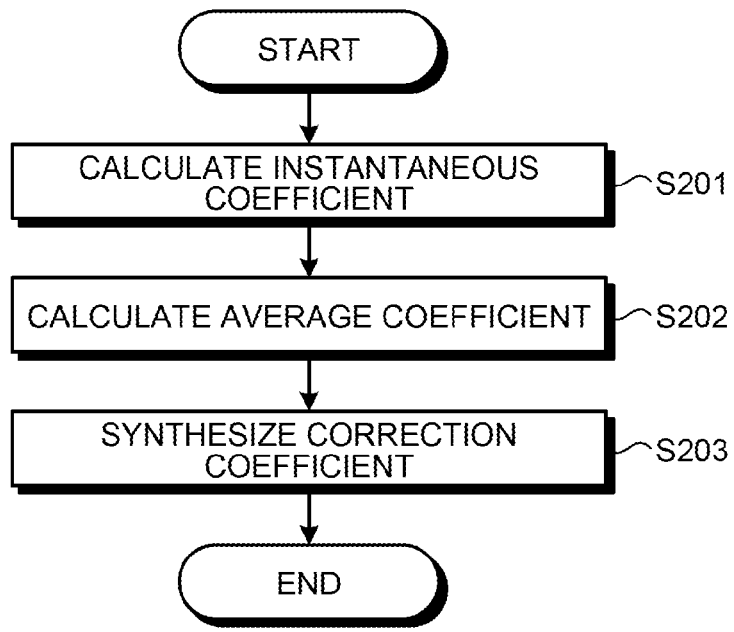
FIG. 4 is a flowchart of a correction coefficient generation process according to the first embodiment.

The correction coefficient generation process performed by the correction coefficient generator 113 will be described with reference to the flowchart represented in FIG. 4.

As described above, the instantaneous coefficient calculator 102 and the average coefficient calculator 103 are notified of the timing for transmitting a burst signal by the timing information. Upon receiving the notification, the instantaneous coefficient calculator 102 acquires the parameter for calculating an instantaneous coefficient from the parameter holder 101 and calculates an instantaneous coefficient by assigning the amplitude of the burst signal to the operation expression using the parameter (step S201). In other words, the instantaneous coefficient is calculated on the basis of the amplitude of the burst signal. Accordingly, in the operation expression used to calculate an instantaneous coefficient, the instantaneous power (or amplitude) of the burst signal is a variable as represented in Expression (1). Because this arithmetic expression is one that approximates characteristics inverse to those of the instantaneous change among the burst distortion, the instantaneous coefficient has characteristics inverse to those of the instantaneous change.

The average coefficient calculator 103 acquires the parameter for calculating an average coefficient from the parameter holder 101 simultaneously with the calculation of an instantaneous coefficient and calculates an average coefficient by assigning the elapsed time from the start of sending the burst signal to the arithmetic expression using the parameter (step S202). In other words, the average coefficient is calculated on the basis of the elapsed time from the start of sending the burst signal. Accordingly, in the arithmetic expression used to calculate the average coefficient, for example, the elapsed time from the start of sending the burst signal is a variable as represented in Expression (2). Because this arithmetic expression is one that approximates the characteristics inverse to those of the average change among the burst distortion, the average coefficient has the characteristics inverse to those of the average change.

The calculated instantaneous coefficient and average coefficient are synthesized by the coefficient synthesizer 104 (step S203). The resultant correction coefficient is then output to the burst distortion corrector 114 and is used to correct the burst distortion. The correction coefficient is obtained by synthesizing the instantaneous coefficient with the average coefficient and therefore correcting the burst distortion by using the correction coefficient corrects both the instantaneous change and the average change contained in the burst distortion.

As described above, according to the first embodiment, the instantaneous coefficient that is calculated on the basis of the instantaneous burst signal and the average coefficient that is calculated on the basis of the elapsed time from the start of sending the burst signal are synthesized with each other and the burst distortion is corrected with the resultant correction coefficient. Accordingly, not only the average change that gradually decreases from the top to the end of the burst signal but also the instantaneous change that instantaneously changes the power of the burst signal are corrected, which enables sufficient correction of the burst distortion.

[b] Second Embodiment

The characteristics of a second embodiment are in that an instantaneous coefficient and an average coefficient that are output from tables that respectively store in advance an instantaneous coefficient and an average coefficient corresponding to the elapsed time from the start of sending a burst signal are synthesized with each other.

Because the radio communication device according to the second embodiment has the same configuration as that of the radio communication device 100 according to the first embodiment (see FIG. 1), descriptions of the radio communication device according to the second embodiment will be omitted. The correction coefficient generator 113 according to the second embodiment has a configuration different from that according to the first embodiment.

Figure 5:
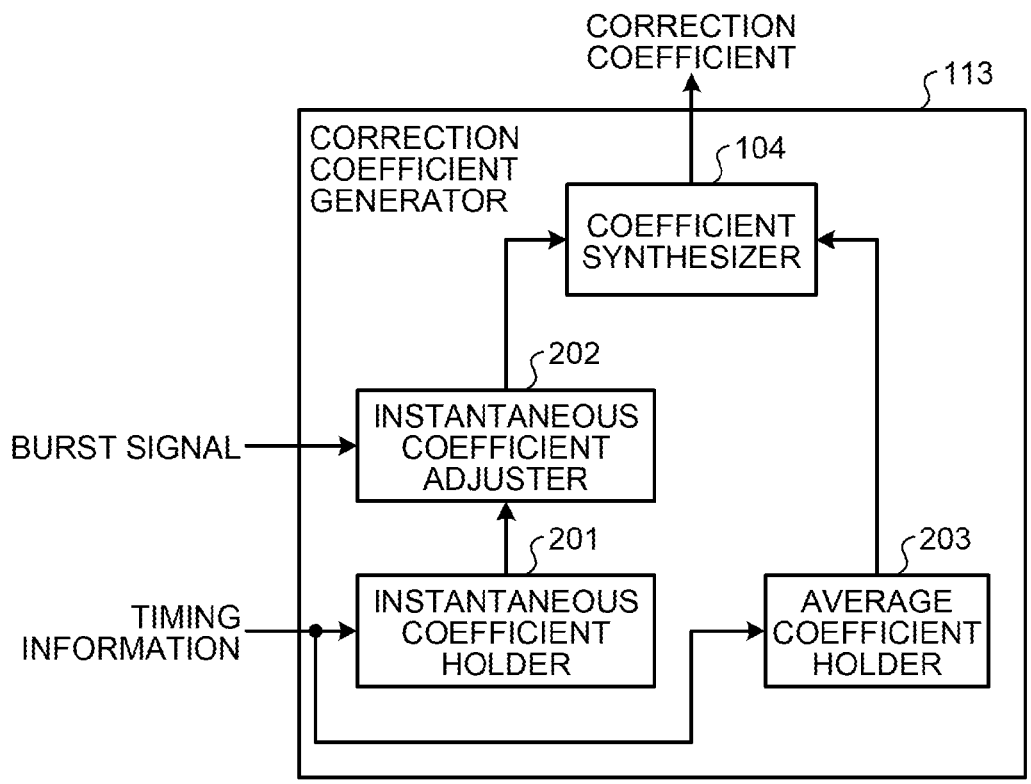
FIG. 5 is a block diagram of a configuration of a correction coefficient generator according to a second embodiment.

FIG. 5 is a block diagram of the configuration of the correction coefficient generator 113 according to the second embodiment. The same components represented in FIG. 5 as those represented in FIG. 2 are denoted with the same reference numbers and descriptions of the same components will be omitted below. The correction coefficient generator 113 represented in FIG. 5 includes an instantaneous coefficient holder 201, an instantaneous coefficient adjuster 202, an average coefficient holder 203, and the coefficient synthesizer 104.

The instantaneous coefficient holder 201 holds a table that stores, with respect to each elapsed time from the start of sending the burst signal, an instantaneous coefficient corresponding to the instantaneous change among the burst distortion. The instantaneous coefficient holder 201 knows the timing for starting sending a burst signal from the timing information and outputs, to the instantaneous coefficient adjuster 202, the instantaneous coefficient corresponding to the elapsed time from the start of the sending.

The instantaneous coefficient adjuster 202 adjusts the instantaneous coefficient that is output from the instantaneous coefficient holder 201 according to the amplitude of the burst signal. In other words, the instantaneous coefficient adjuster 202 multiply the instantaneous coefficient, which is output from the instantaneous coefficient holder 201, by an absolute value of the amplitude of the burst signal. The instantaneous coefficient thus adjusted is based on the elapsed time from the start of sending the burst signal and based on the instantaneous power (or the absolute value of the amplitude) of the burst signal.

The average coefficient holder 203 holds a table that stores, with respect to each elapsed time from the start of sending the burst signal, an average coefficient corresponding to the average change among the burst distortion. The average coefficient holder 203 knows the timing for starting sending the burst signal from the timing information and outputs, to the coefficient synthesizer 104, the average coefficient corresponding to the elapsed time from the start of the sending. In other words, the average coefficient is based on the elapsed time from the start of sending the burst signal.

Figure 6:
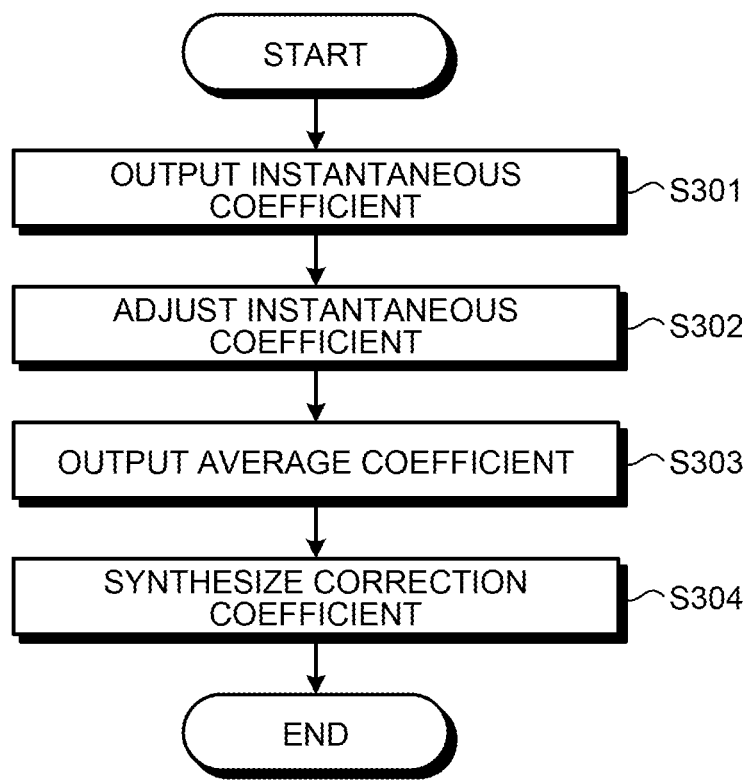
FIG. 6 is a flowchart of a correction coefficient generation process according to the second embodiment.

The correction coefficient generation process performed by the correction coefficient generator 113 having the above-described configuration will be described with reference to the flowchart represented in FIG. 6.

The instantaneous coefficient holder 201 and the average coefficient holder 203 are notified of the timing for transmitting a burst signal by the timing information. Upon receiving the notification, the instantaneous coefficient holder 201 reads, from the table, the instantaneous coefficient corresponding to the elapsed time from the start of sending the burst signal and outputs the instantaneous coefficient to the instantaneous coefficient adjuster 202 (step S301). The instantaneous coefficient that is output is adjusted by the instantaneous coefficient adjuster 202 (step S302). In other words, for example, the instantaneous coefficient is multiplied by the absolute value of the amplitude of the burst signal and accordingly the instantaneous power of the burst signal is reflected to the instantaneous coefficient. The instantaneous coefficient that is adjusted on the basis of the instantaneous power of the burst signal is output from the instantaneous coefficient adjuster 202 to the coefficient synthesizer 104.

The average coefficient holder 203 reads the average coefficient corresponding to the elapsed time from the start of sending the burst signal from the table simultaneously with the output and adjustment of the instantaneous coefficient and outputs the average coefficient to the coefficient synthesizer 104 (step S303).

The instantaneous coefficient and the average coefficient are synthesized with each other by the coefficient synthesizer 104 (step S304). The resultant correction coefficient is output to the burst distortion corrector 114 and is used to correct the burst distortion. The correction coefficient is obtained by synthesizing the instantaneous coefficient and the average coefficient with each other and therefore correcting the burst distortion by using the correction coefficient corrects both the instantaneous change and the average change contained in the burst distortion.

As described above, according to the second embodiment, the instantaneous coefficient and the average coefficient corresponding to the elapsed time from the start of sending the burst signal are read from the tables and, after being adjusted on the basis of the instantaneous power of the burst signal, the instantaneous coefficient is synthesized with the average coefficient. By using the resultant correction coefficient, the burst distortion is corrected. For this reason, not only the average change that that gradually decreases from the top to the end of the burst signal but also the instantaneous change that changes the power of the burst signal instantaneously are corrected, which enables sufficient correction of the burst signal. Furthermore, for example, even when the changes of burst distortion according to the time are irregular and it is difficult to calculate the instantaneous coefficient and the average coefficient from the arithmetic expression, creating the tables in advance enables correction of the burst distortion.

[c] Third Embodiment

The characteristics of a third embodiment are in that arithmetic expressions respectively for calculating an instantaneous coefficient and an average coefficient are switched according to the elapsed time from the top of a burst signal.

Because the radio communication device according to the third embodiment has the same configuration as that of the radio communication device 100 according to the first embodiment (see FIG. 1), descriptions of the radio communication device according to the third embodiment will be omitted. The correction coefficient generator 113 according to the third embodiment has a configuration different from that according to the first embodiment.

Figure 7:
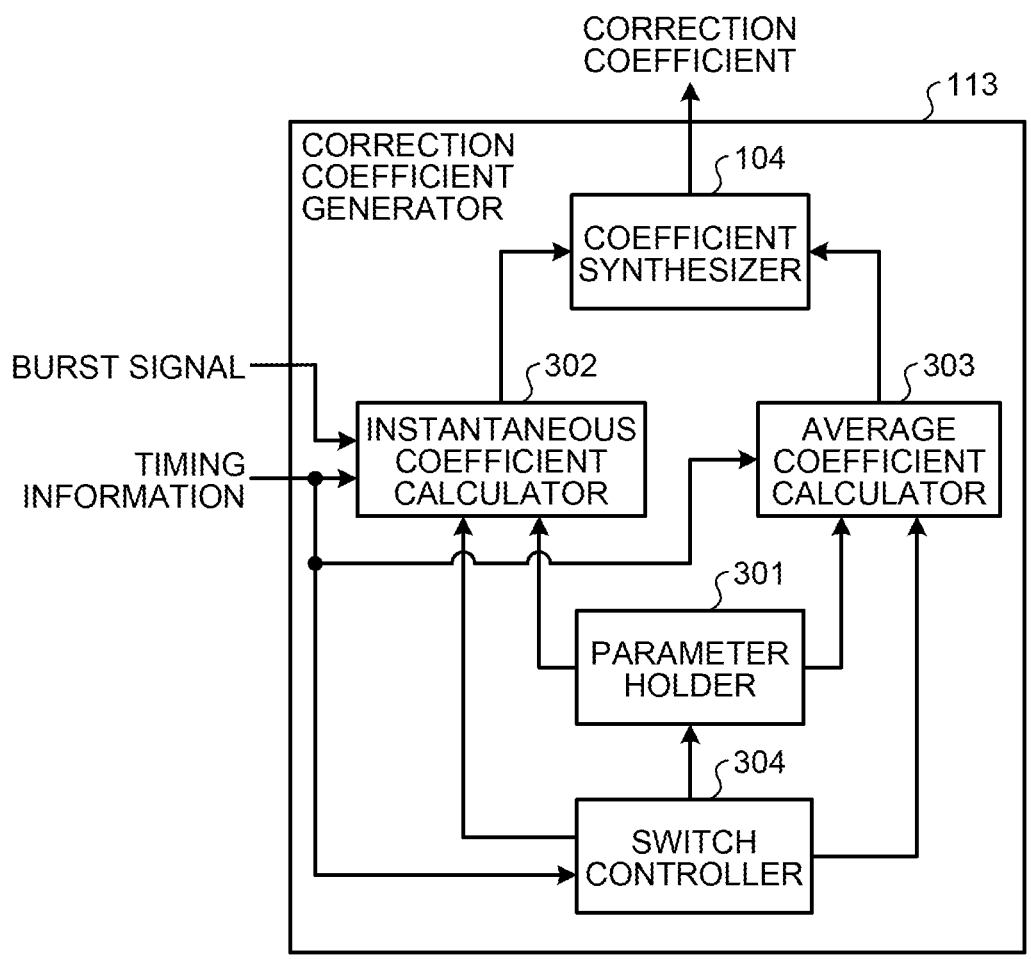
FIG. 7 is a block diagram of a configuration of a correction coefficient generator according to a third embodiment.

FIG. 7 is a block diagram of the configuration of the correction coefficient generator 113 according to the third embodiment. The same components represented in FIG. 7 as those represented in FIG. 2 are denoted with the same reference numbers and descriptions of the same components will be omitted below. The correction coefficient generator 113 represented in FIG. 7 includes a parameter holder 301, an instantaneous coefficient calculator 302, an average coefficient calculator 303, a switch controller 304 and the coefficient synthesizer 104.

Figure 8:
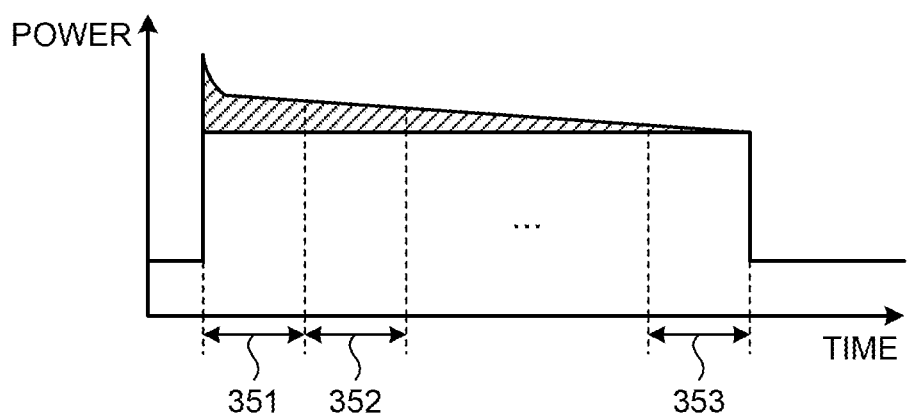
FIG. 8 is a graph of a specific example of sections of a burst signal.

The parameter holder 301 holds a parameter for calculating an instantaneous coefficient having characteristics inverse to those of an instantaneous change among a burst distortion and a parameter for calculating an average coefficient having characteristics inverse to those of an average change among the burst distortion. In other words, the parameter holder 301 holds the parameters contained in arithmetic expressions for calculating an instantaneous coefficient and an average coefficient. Note that the parameter holder 301 holds different multiple parameter groups corresponding to the elapsed times from the top of a burst signal. In other words, the parameter holder 301 holds different parameter groups with respect to, for example, sections 351, 352, . . . , and 353 of the burst signal represented in FIG. 8.

The instantaneous coefficient calculator 302 stores the arithmetic expression for calculating an instantaneous coefficient. Upon detecting that sending a burst signal is to be started from timing information that is output from the burst signal generator 111, the instantaneous coefficient calculator 302 calculates an instantaneous coefficient by using the arithmetic expression. The instantaneous coefficient calculator 302 calculates an instantaneous coefficient by assigning the amplitude of the burst signal to the arithmetic expression using the parameter corresponding to the elapsed time from the top of the burst signal among the parameter groups held by the parameter holder 301. Furthermore, the instantaneous coefficient calculator 302 stores different multiple arithmetic expressions with respect to the elapsed times from the top of the burst signal and uses an arithmetic expression corresponding to the elapsed time to calculate an instantaneous coefficient. In this manner, the instantaneous coefficient calculator 302 uses a different parameter and a different arithmetic expression with respect to each section of the burst signal to calculate an instantaneous coefficient.

The average coefficient calculator 303 stores the arithmetic expression for calculating an average coefficient. Upon detecting that sending a burst signal is to be started from the timing information that is output from the burst signal generator 111, the average coefficient calculator 303 calculates an average coefficient by using the arithmetic expression. The average coefficient calculator 303 calculates an average coefficient by assigning the elapsed time from the top of sending the burst signal to the arithmetic expression using the parameter corresponding to the elapsed time from the top of the burst signal among the parameter groups held by the parameter holder 301. Furthermore, the average coefficient calculator 303 stores different multiple arithmetic expressions with respect to the elapsed time from the top of the burst signal and uses an arithmetic expression corresponding to the elapsed time to calculate an average coefficient. In this manner, the average coefficient calculator 303 uses a different parameter and a different arithmetic expression with respect to each section of the burst signal to calculate an average coefficient.

The switch controller 304 detects that a boundary between sections of the burst signal has come according to the timing information and controls switching of the parameter and the arithmetic expression performed by the instantaneous coefficient calculator 302 and the average coefficient calculator 303. In other words, with respect to, for example, the section 351 represented in FIG. 8, the switch controller 304 controls the parameter holder 301 so as to output a parameter corresponding to the section 351 and controls the instantaneous coefficient calculator 302 and the average coefficient calculator 303 so as to use arithmetic expressions corresponding to the section 351.

According to the third embodiment, a different parameter and a different arithmetic expression with respect to each section of the burst signal are used to calculate an instantaneous coefficient and an average coefficient. For this reason, even when the characteristics of the burst distortion differ with respect to each section of the burst signal, sufficient correction of the burst signal is enabled. In other words, it is assumed that the burst distortion characteristics represented by stripes in FIG. 8 differ between the section 351 and the section 353 and, according to the third embodiment, parameters and arithmetic expressions that are different between the section 351 and the section 353 are used. This enables correction corresponding to the characteristics of the burst distortion in each section, which improves the accuracy of correction. According to FIG. 8, all the sections 351 to 353 have equal widths. Alternatively, the widths of the sections may be unequal. Furthermore, not both but any one of the parameter and arithmetic expression may be switched according to the section. Alternatively, only the parameter and arithmetic expression for calculating an average coefficient may be switched without switching the parameter and arithmetic expression for calculating an instantaneous coefficient.

As described above, according to the third embodiment, an instantaneous coefficient and an average coefficient are calculated by using a different parameter and an different arithmetic expression according to the elapsed time from the top of the burst signal and the correction coefficient that is obtained by synthesizing the calculated instantaneous coefficient and average coefficient is used to correct the burst distortion. This enables correction corresponding to the characteristics of the burst distortion with respect to each section of the burst signal and accordingly enables improvement in accuracy of the correction.

[d] Fourth Embodiment

The characteristics of a fourth embodiment are in that a radio communication device includes a correction coefficient generator corresponding to power levels in accordance with burst signals at different power levels and the correction coefficient generator performs a correction coefficient generation process corresponding to the power level of a burst signal.

Figure 9:
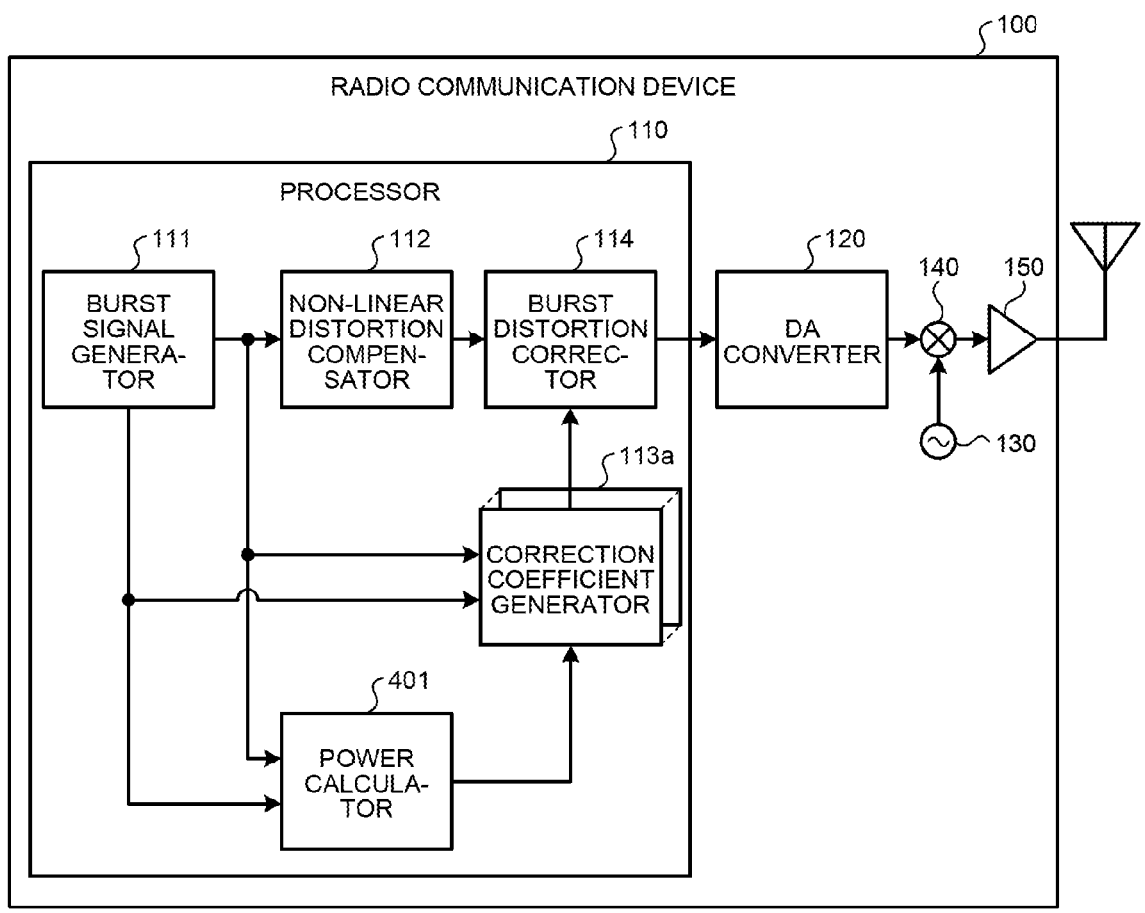
FIG. 9 is a block diagram of a configuration of a radio communication device according to a fourth embodiment.

FIG. 9 is a block diagram of a configuration of a radio communication device 100 according to the fourth embodiment. The same components represented in FIG. 9 as those represented in FIG. 1 are denoted with the same reference numbers and descriptions of the same components will be omitted below. The radio communication device 100 includes a correction coefficient generator 113a and a power calculator 401 instead of the correction coefficient generator 113 in the processor 110 of the radio communication device 100 represented in FIG. 1.

The correction coefficient generator 113a performs multiple correction coefficient generation processes corresponding to power levels of the burst signal. Each correction coefficient generation process performed by the correction coefficient generator 113a may be same as any one of those according to the first to third embodiments. In other words, the correction coefficient generator 113a acquires an instantaneous coefficient and an average coefficient by using arithmetic expressions that differ between the power levels of the burst signal or a table and outputs, to the burst distortion corrector 114, the correction coefficient obtained by synthesizing the acquired instantaneous coefficient and average coefficient.

The power calculator 401 knows the timing for sending a burst signal according to the timing information that is output from the burst signal generator 111 and calculates the power level of the burst signal. The power calculator 401 then issues, to the correction coefficient generator 113a, an instruction for performing a correction coefficient generation process corresponding to the calculated power level. In other words, the power calculator 401 issues an instruction for obtaining an instantaneous coefficient and an average coefficient by using, for example, an arithmetic expression corresponding to the power level of the burst signal or the table.

According to the fourth embodiment, there is not only one type of power level of the burst signal and burst signals at different power levels are transmitted from the radio communication device 100. For this reason, the power level of the burst signal is calculated by the power calculator 401 and the correction coefficient generation process corresponding to the power level is performed by the correction coefficient generator 113a. Because the characteristics of the burst distortion may vary according to the power level of the burst signal, performing the correction coefficient generation process corresponding to each power level enables efficient correction of the burst distortion even when the power level of the burst signal changes.

As described above, according to the fourth embodiment, the power level of the burst signal is calculated and the burst distortion is corrected by using the correction coefficient that is generated by performing the correction coefficient generation process corresponding to the power level. Accordingly, even when the power level of the burst signal changes to multiple stages, it is possible to correct the burst distortion efficiently.

[e] Fifth Embodiment

The characteristics of a fifth embodiment are in that an output of a power amplifier is sent as a feedback signal and parameters used for arithmetic expressions for calculating an instantaneous coefficient and an average coefficient are updated such that a burst distortion contained in the feedback signal decreases.

Figure 10:
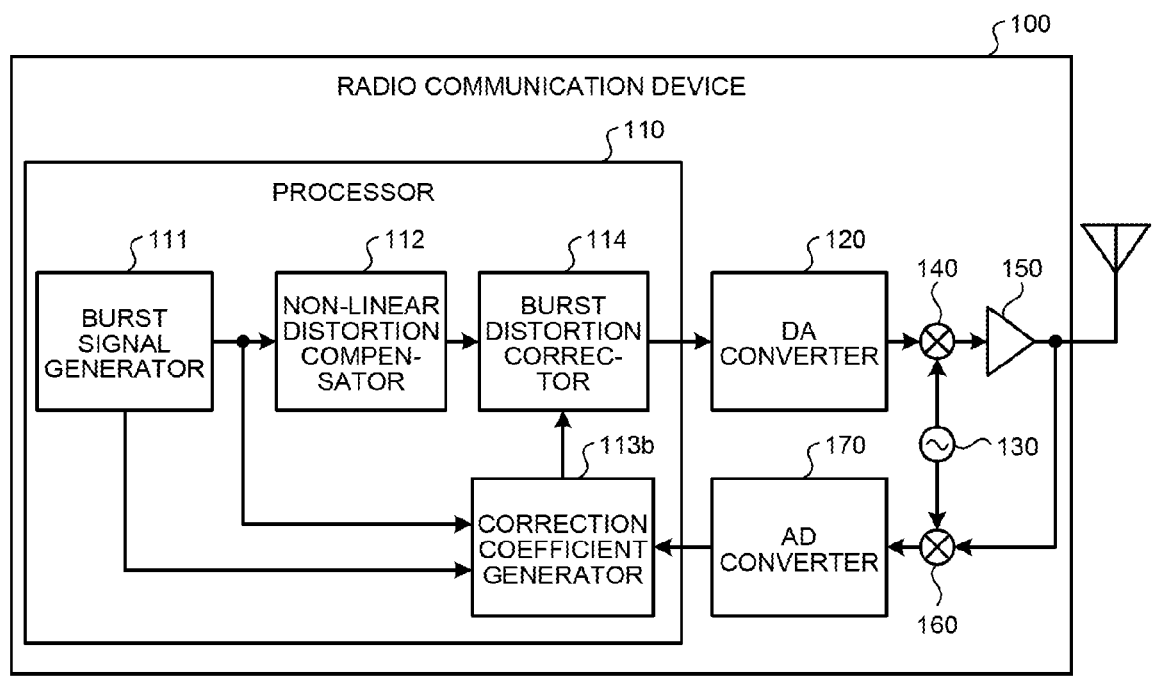
FIG. 10 is a block diagram of a configuration of a radio communication device according to a fifth embodiment.

FIG. 10 is a block diagram of a configuration of a radio communication device 100 according to the fifth embodiment. The same components represented in FIG. 10 as those represented in FIG. 1 are denoted with the same reference numbers and descriptions of the same components will be omitted below. The radio communication device 100 has a configuration obtained by adding a mixer 160 and an analogue digital (AD) converter 170 to the radio communication device 100 represented in FIG. 1, and the radio communication device 100 includes a correction coefficient generator 113b instead of the correction coefficient generator 113 in the processor 110.

The mixer 160 sends a radio signal that is output from the power amplifier 150 as a feedback signal and down-converts the feedback signal by using a local signal that is generated by the oscillator 130. In other words, the mixer 160 converts the frequency of the feedback signal from the radio frequency to a baseband frequency.

The AD converter 170 performs AD conversion on the feedback signal and outputs the resultant digital feedback signal to the processor 110.

The correction coefficient generator 113b generates a correction coefficient for correcting a burst distortion. The correction coefficient generator 113b generates an average coefficient that corrects an average change that decreases gradually from the top to the end of the burst signal and an instantaneous coefficient that corrects an instantaneous change that changes the power of the burst signal instantaneously and generates a correction coefficient by synthesizing the average coefficient and the instantaneous change with each other. Furthermore, the correction coefficient generator 113b uses the burst signal and the feedback signal that is output from the AD converter 170 to update the parameters for calculating an instantaneous coefficient and an average coefficient. Specifically, the correction coefficient generator 113b has the configuration represented in FIG. 11.

Figure 11:
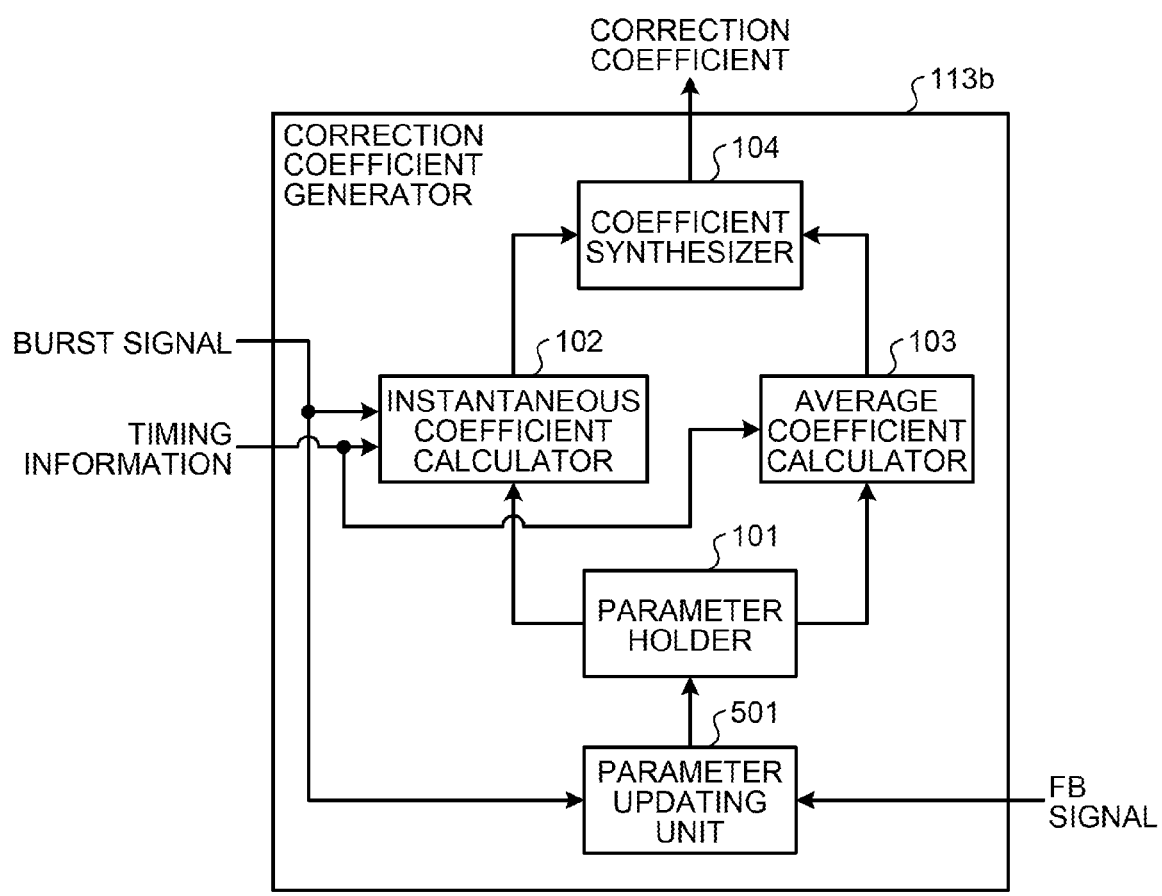
FIG. 11 is a block diagram of a configuration of a correction coefficient generator according to the fifth embodiment.

FIG. 11 is a block diagram of a configuration of the correction coefficient generator 113b according to the fifth embodiment. The same components represented in FIG. 11 as those represented in FIG. 2 are denoted with the same reference numbers and descriptions of the same components will be omitted below. The correction coefficient generator 113b represented in FIG. 11 employs the configuration obtained by adding a parameter updating unit 501 to the correction coefficient generator 113 represented in FIG. 2.

The parameter updating unit 501 updates the parameters that are stored in the parameter holder 101 such that the error between the burst signal that is output from the burst signal generator 111 and the feedback signal (simplified as "FB signal" in FIG. 11) that is output from the AD converter 170 decreases. In other words, because the parameter holder 101 holds the parameters for calculating an instantaneous coefficient and for calculating an average coefficient, the parameter updating unit 501 updates the parameters for calculating an instantaneous coefficient and for calculating an average coefficient such that the burst distortion remaining in the feedback signal decreases. On the basis of the error in instantaneous power between the burst signal and the feedback signal, the parameter updating unit 501 updates the parameter for calculating an instantaneous coefficient. On the other hand, in a state where correction of the burst distortion performed by the burst distortion corrector 114 is not performed, the parameter updating unit 501 updates the parameter for calculating an average coefficient on the basis of the error in average power in a given section of the burst signal.

Figure 12:
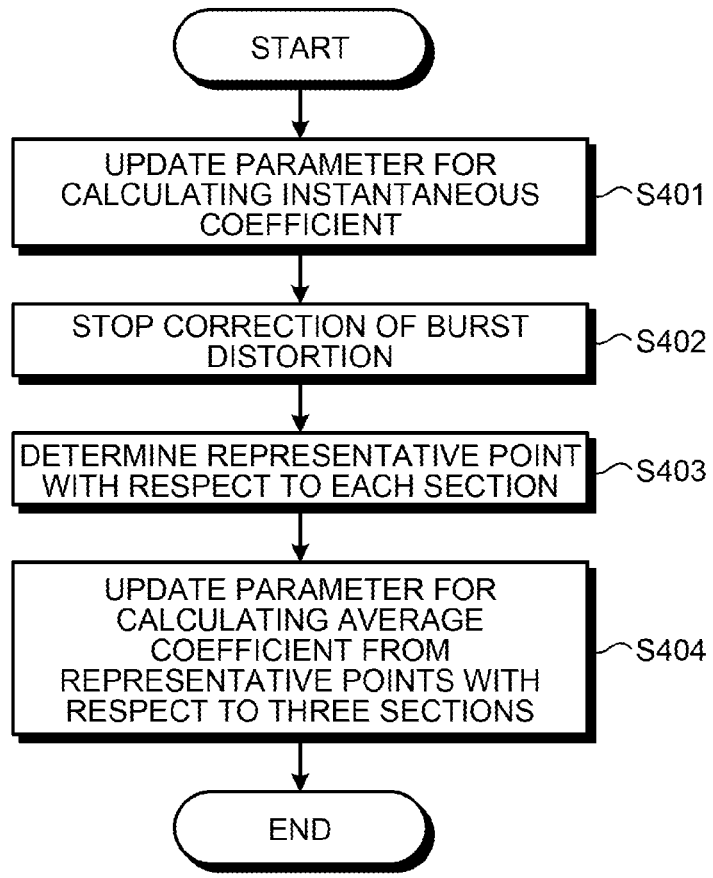
FIG. 12 is a flowchart of a parameter updating process according to the fifth embodiment.

The parameter updating process performed by the parameter updating unit 501 will be described specifically with reference to the flowchart represented in FIG. 12.

Once the burst signal that is generated by the burst signal generator 111 and the feedback signal that is output from the AD converter 170 are input to the parameter updating unit 501, the parameter for calculating an instantaneous coefficient is updated at first (step S401). In other words, the parameter for calculating an instantaneous coefficient is updated such that the error in instantaneous power between the burst signal and the feedback signal decreases. Needless to say, in consideration of the process delay until the input of the burst signal generated by the burst signal generator 111 to the correction coefficient generator 113b as the feedback signal, the process based on the error in instantaneous power between the delayed burst signal and feedback signal is performed.

On the other hand, when the parameter for calculating an average coefficient is updated, correction of the burst distortion performed by the burst distortion corrector 114 is stopped temporarily (step S402). Accordingly, thereafter, the feedback signal in which the complete burst distortion remains is input to the parameter updating unit 501. The parameter updating unit 501 then calculates the error in instantaneous power between the burst signal and the feedback signal over all sections of one burst signal. Furthermore, at least three sections are set over all sections on which the error in instantaneous power is calculated and an average of the errors in instantaneous power of each of the sections is calculated. The calculated average is determined as a representative point with respect to each section (step S403).

Figure 13:
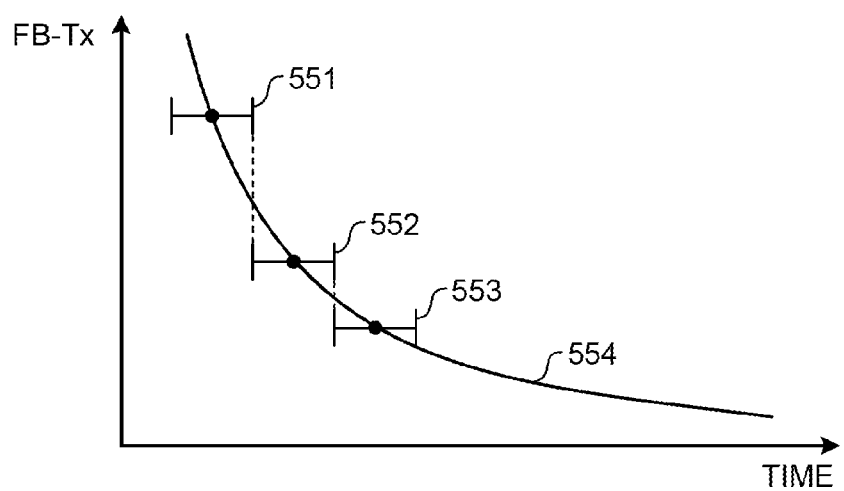
FIG. 13 is a graph illustrating a specific example of updating a parameter.

The representative point of each section will be described with reference to the specific example represented in FIG. 13. FIG. 13 is a diagram representing a coordinate system in which the vertical axis represents the error in power between the burst signal and the feedback signal and the horizontal axis represents the time. Here, because correction of the burst distortion stops temporarily, the burst distortion remains in the feedback signal. Accordingly, the error in power between the burst signal and the feedback signal increases in a part close to the top of the burst signal and the error in power between the burst signal and the feedback signal decreases as it reaches the end of the burst signal. For this reason, when the average of the errors in power with respect to each of the sections 551, 552 and 553 is calculated, the average with respect to the section 553 is the smallest. As represented in FIG. 13, the point corresponding to the time at the center with respect to each section and the average with respect to each section serves as the representative point of each section.

When the representative points with respect to at least three sections are obtained, the parameter updating unit 501 updates the parameter for calculating an average coefficient from the representative points with respect to the three sections (step S404). Specifically, a curved line 554 that passes through the representative points with respect to the three sections 551, 552 and 553 represented in FIG. 13 is calculated and the parameter corresponding to the curved line 554 serves as a parameter for calculating an average coefficient. Because the representative points with respect to the sections 551, 552 and 553 represent the errors in power between the burst signal and the feedback signal, the curved line 554 is a curve that approximates an average change that occurs due to the burst distortion. Calculating a parameter that offsets the curved line 554 therefore enables calculation of a parameter suitable for calculating an average coefficient.

According to the fifth embodiment, the parameter for calculating an instantaneous coefficient is updated such that the error in instantaneous power between the burst signal and the feedback signal decreases. Furthermore, the parameter for calculating an average coefficient is updated such that the error in average power between the burst signal and the feedback signal over a given section decreases. Because the parameters thus updated are held by the parameter holder 101, the instantaneous coefficient calculator 102 and the average coefficient calculator 103 use the arithmetic expressions using the updated parameters to calculate an instantaneous coefficient and an average coefficient, respectively. Accordingly, an instantaneous coefficient and an average coefficient that accurately offset the instantaneous change and the average change are calculated and the accuracy of the correction coefficient obtained by synthesizing the instantaneous coefficient with the average coefficient improves. This enables improvement of accuracy of correction of the burst distortion performed by the burst distortion corrector 114.

As described above, according to the fifth embodiment, the parameters for calculating an instantaneous coefficient and calculating an average coefficient are updated such that the error in power between the burst signal and the feedback signal decreases and the arithmetic expressions using the updated parameters are used to calculate a correction coefficient. This enables improvement of accuracy of the correction coefficient and improvement of accuracy of correction of the burst distortion.

[f] Sixth Embodiment

The characteristics of a sixth embodiment are in that an instantaneous coefficient and an average coefficient that are stored in tables in advance in accordance with the elapsed time from the start of sending a burst signal are updated such that a burst distortion contained in a feedback signal decreases.

Because the radio communication device according to the sixth embodiment has the same configuration as that of the radio communication device 100 (see FIG. 10) according to the fifth embodiment, descriptions of the radio communication device according to the sixth embodiment will be omitted; however, the correction coefficient generator 113*b* according to the sixth embodiment has a configuration different from that according to the fifth embodiment.

Figure 14:
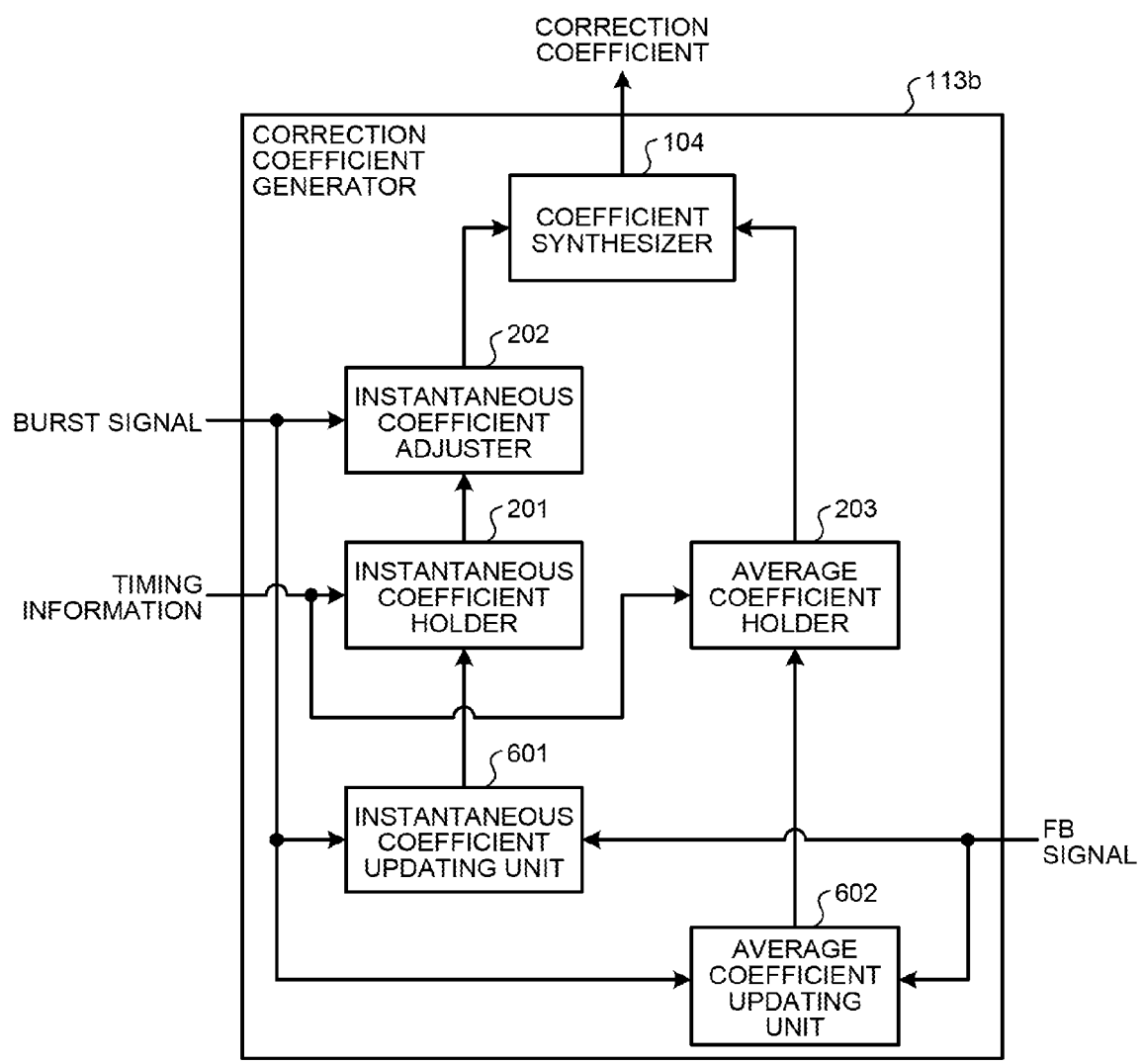
FIG. 14 is a block diagram of a configuration of a correction coefficient generator according to a sixth embodiment.

FIG. 14 is a block diagram of a configuration of the correction coefficient generator 113*b* according to the sixth embodiment. The same components represented in FIG. 14 as those represented in FIGS. 2 and 5 are denoted with the same reference numbers and descriptions of the same components will be omitted below. The correction coefficient generator 113*b* represented in FIG. 14 employs a configuration obtained by adding an instantaneous coefficient updating unit 601 and an average coefficient updating unit 602 to the correction coefficient generator 113 represented in FIG. 5.

The instantaneous coefficient updating unit 601 updates the instantaneous coefficient that is stored in the instantaneous coefficient holder 201 such that the error between the burst signal that is output from the burst signal generator 111 and the feedback signal (simplified as "FB signal" in FIG. 14) that is output from the AD converter 170 decreases. In other words, because the instantaneous coefficient holder 201 holds instantaneous coefficients with respect to respective elapsed times from the start of sending the burst signal, the instantaneous coefficient updating unit 601 updates the instantaneous coefficient such that the burst distortion remaining in the feedback signal decreases. On the basis of the error in instantaneous power between the burst signal and the feedback signal, the instantaneous coefficient updating unit 601 updates the instantaneous coefficient that is used to correct the burst distortion remaining in the feedback signal.

The average coefficient updating unit 602 updates the average coefficient that is stored in the average coefficient holder 203 such that the error between the burst signal that is output from the burst signal generator 111 and the feedback signal that is output from the AD converter 170 decreases. In other words, because the average coefficient holder 203 holds the average coefficients with respect to the respective elapsed times from the start of sending the burst signal, the average coefficient updating unit 602 updates the average coefficient such that the burst distortion remaining in the feedback signal decreases. The average coefficient updating unit 602 may update the average coefficient on the basis of the errors in instantaneous power between the burst signal and the feedback signal at multiple timings. In other words, the average coefficient updating unit 602 may update the average coefficient on the basis of the error in instantaneous power between the burst signal and the feedback signal at a timing corresponding to the average coefficient to be updated and the errors in instantaneous power between the burst signal and the feedback signal at timings before and after that corresponding timing.

According to the sixth embodiment, the instantaneous coefficient and the average coefficient are updated such that the error in instantaneous power between the burst signal and the feedback signal decreases. Because the instantaneous coefficient and the average coefficient that are thus updated are held by the instantaneous coefficient holder 201 and the average coefficient holder 203, respectively, the coefficient synthesizer 104 generates a correction coefficient by synthesizing the updated instantaneous coefficient with the average coefficient. Accordingly, a correction coefficient that accurately offsets the instantaneous change and the average change is generated and accordingly accuracy of correction of the burst distortion performed by the burst distortion corrector 114 can be improved.

As described above, according to the sixth embodiment, the instantaneous coefficient and the average coefficient are updated such that the error in power between the burst signal and the feedback signal decreases and the correction coefficient is generated by synthesizing the updated instantaneous coefficient and average coefficient with each other. This enables improvement of the accuracy of the correction coefficient and improvement of the accuracy of correction of the burst distortion.

[g] Seventh Embodiment

The characteristics of a seventh embodiment are in that only a burst signal at a high power level among multiple burst signals at different power levels is used to perform an updating process relating to generation of a correction coefficient.

Figure 15:
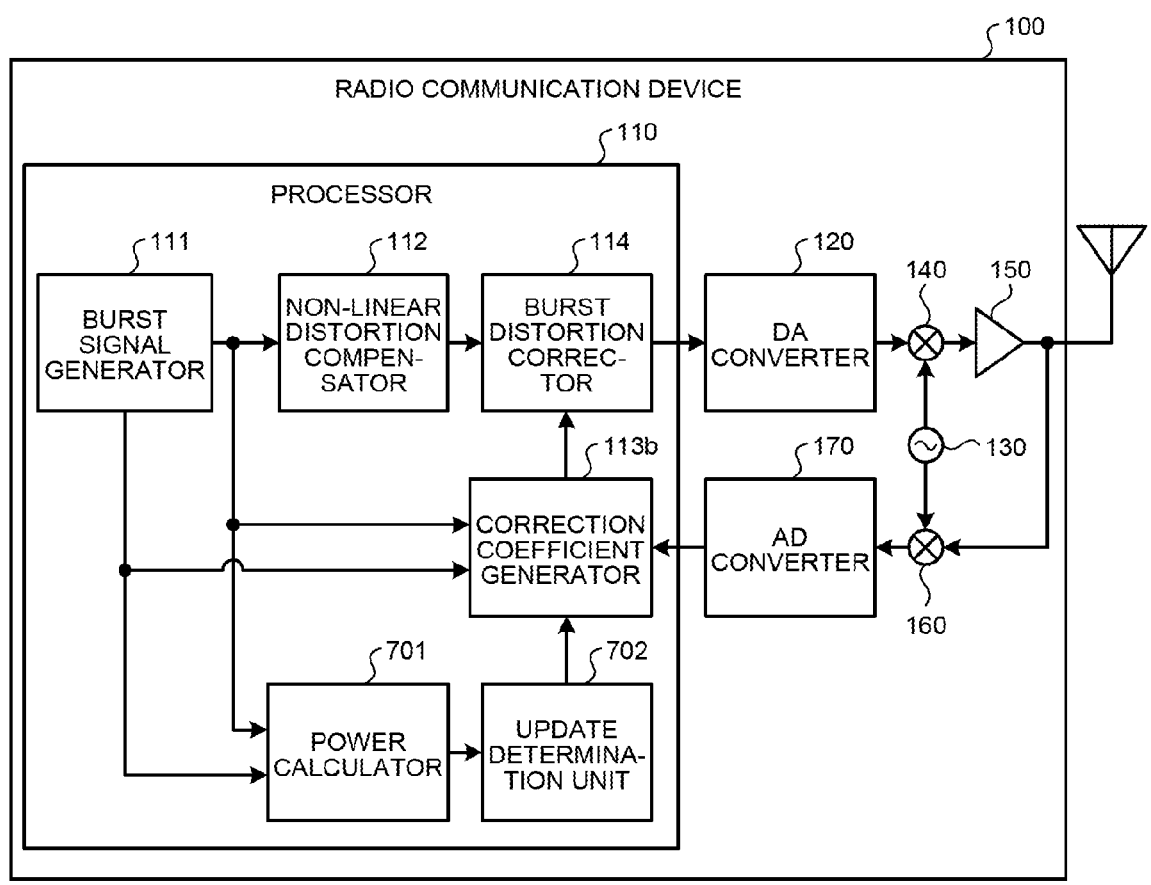
FIG. 15 is a block diagram of a configuration of a radio communications device according to a seventh embodiment.

FIG. 15 is a block diagram of a configuration of a radio communication device 100 according to a seventh embodiment. The same components represented in FIG. 15 as those represented in FIGS. 1 and 10 are denoted with the same reference numbers and descriptions of the same components will be omitted below. The radio communication device 100 represented in FIG. 15 employs a configuration obtained by adding a power calculator 701 and an update determination unit 702 to the processor 110 of the radio communication device 100 represented in FIG. 10.

The power calculator 701 understands the timing at which a burst signal is sent from the timing information that is output from the burst signal generator 111 and calculates the power level of the burst signal. The power calculator 701 then notifies the update determination unit 702 of the calculated power level.

The update determination unit 702 determines whether the power level notified by the power calculator is equal to or higher than a given level and, when the power level of the burst signal is equal to or higher than the given level, the update determination unit 702 issues an instruction for performing an updating process relating to a correction coefficient to the correction coefficient generator 113*b*. As described with respect to the fifth and sixth embodiments, the correction coefficient generator 113*b* updates the parameters used for the arithmetic expressions for calculating an instantaneous coefficient and an average coefficient or updates the instantaneous coefficient and the average coefficient. When the update determination unit 702 determines to perform the updating process on the basis of the power level of the burst signal, the update determination unit 702 issues an instruction for updating the parameters used for the arithmetic expressions and for updating the instantaneous coefficient and the average coefficient.

According to the seventh embodiment, there is not only one type of power level of the burst signal and burst signals at different power levels are transmitted from the radio communication device 100. For this reason, the power level of the burst signal is calculated by the power calculator 701 and whether to perform the updating process relating to generation of a correction coefficient is determined by the update determination unit 702. Generally, a burst distortion tends to increase when the power level of the burst signal is high. For this reason, switching on whether to perform the updating process such that a correction coefficient suitable for a burst signal at a higher power level is generated enables accurate correction of a large burst distortion.

According to the seventh embodiment, because a correction coefficient suitable for a burst signal at a high power level is generated, correction of the burst signal performed by the burst distortion corrector 114 is not necessarily performed on burst signals at power levels equal to or smaller than the given level. As described above, the magnitude of the burst distortion varies according to the power level and, when the power level of the burst signal is low, the burst distortion tends to be small. For this reason, even if the burst distortion is not corrected with respect to the burst signal at a low level, its influence is small.

As described above, according to the seventh embodiment, the power level of the burst signal is calculated and, on the basis of the power level, it is determined whether to perform the updating process relating to generation of a correction coefficient. For this reason, even when the power level of the burst signal varies to multiple stages, it is possible to generate a correction coefficient suitable for a burst signal in which a large burst distortion can occur and thus to correct the burst distortion efficiently.

Note that the above-described embodiments may be combined to be performed. In other words, for example, the second embodiment and the third embodiment may be combined and an instantaneous coefficient and an average coefficient may be read from different tables according to the elapsed time from the top of the burst signal.

According to the above-described embodiments, the burst signal and the timing information are output from the burst signal generator 111; however, the burst signal generator 111 does not necessarily include the radio communication device 100. In other words, for example, in a radio communication system in which a base band unit (BBU) and a remote radio head (RRH) are connected with, for example, an optical fiber, the RRH may acquire a burst signal and timing information from the BBU. Furthermore, the RRH may monitor the input power from the optical fiber and, when the input power is at a given threshold or higher, the RRH may determine that the burst signal is received from the BBU and generate timing information based on the determination result.

According to an embodiment of the radio communication device and the burst distortion correcting method disclosed herein, it is possible to correct a burst distortion sufficiently.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A radio communication device comprising:
an instantaneous coefficient acquisition unit that acquires an instantaneous coefficient that corrects an instantaneous change contained in a burst distortion corresponding to an elapsed time from a top of a burst signal in which a constant power level continues and instantaneously changes the power level of the burst signal;
an average coefficient acquisition unit that acquires an average coefficient that corrects an average change contained in the burst distortion and gradually changes the power level of the burst signal from the top to an end of the burst signal;
a synthesizer that synthesizes the instantaneous coefficient acquired by the instantaneous coefficient acquisition unit with the average coefficient acquired by the average coefficient acquisition unit; and
a corrector that uses a correction coefficient obtained from the synthesizing by the synthesizer to correct the burst distortion occurring in the burst signal.

2. The radio communication device according to claim 1, wherein the instantaneous coefficient acquisition unit includes an instantaneous coefficient calculator that calculates the instantaneous coefficient by using an arithmetic expression having amplitude of the burst signal as a variable.

3. The radio communication device according to claim 2, wherein the instantaneous coefficient calculator stores a plurality of arithmetic expressions, each of the plurality of arithmetic expressions have the amplitude of the burst signal as a variable and the instantaneous coefficient calculator uses a different arithmetic expression according to the elapsed time from the top of the burst signal to calculate the instantaneous coefficient.

4. The radio communication device according to claim 1, wherein the average coefficient acquisition unit includes an average coefficient calculator that calculates the average coefficient by using an arithmetic expression having elapsed time from the top of the burst signal as a variable.

5. The radio communication device according to claim 4, wherein the average coefficient calculator stores a plurality of arithmetic expressions, each of the plurality of arithmetic expressions have the elapsed time from the top of the burst signal as a variable and the average coefficient calculator uses a different arithmetic expression according to the elapsed time from the top of the burst signal to calculate the average coefficient.

6. The radio communication device according to claim 1, wherein the instantaneous coefficient acquisition unit includes:
an instantaneous coefficient holder that holds a plurality of instantaneous coefficients in association with elapsed times from the top of the burst signal and outputs an instantaneous coefficient corresponding to the elapsed time from the top of the burst signal; and
an instantaneous coefficient adjuster that adjusts the instantaneous coefficient output from the instantaneous coefficient holder according to amplitude of the burst signal.

7. The radio communication device according to claim 1, wherein the average coefficient acquisition unit includes an average coefficient holder that holds a plurality of average coefficients in association with elapsed times from the top of the burst signal and outputs an average coefficient corresponding to the elapsed time of the burst signal.

8. The radio communication device according to claim 1, further comprising a power calculator that calculates the power level of the burst signal, wherein
the instantaneous coefficient acquisition unit acquires the instantaneous coefficient corresponding to the power level calculated by the power calculator, and
the average coefficient acquisition unit acquires the average coefficient corresponding to the power level calculated by the power calculator.

9. The radio communication device according to claim 1, further comprising:
an amplifier that amplifies the burst signal whose burst distortion is corrected by the corrector; and an updating unit that performs an updating process relating to the instantaneous coefficient and the average coefficient by using a burst signal whose burst distortion is not corrected yet by the corrector and a feedback signal fed back after being amplified by the amplifier.

10. The radio communication device according to claim 9, wherein the updating unit updates a parameter contained in an arithmetic expression for calculating an instantaneous coefficient and an average coefficient by using the burst signal and the feedback signal.

11. The radio communication device according to claim 9, wherein the updating unit updates the instantaneous coefficient and the average coefficient that are held in association with the elapsed time from the top of the burst signal by using the burst signal and the feedback signal.

12. The radio communication device according to claim 9, further comprising:

a power calculator that calculates the power level of the burst signal; and an update determination unit that determines whether to perform the updating process performed by the updating unit on the basis of the power level calculated by the power calculator.

13. A burst distortion correcting method comprising:

acquiring an instantaneous coefficient that corrects an instantaneous change contained in a burst distortion corresponding to an elapsed time from a top of a burst signal in which a constant power level continues and instantaneously changes the power level of the burst signal;

acquiring an average coefficient that corrects an average change contained in the burst distortion and gradually changes the power level of the burst signal from the top to an end of the burst signal;

generating a correction coefficient by synthesizing the acquired instantaneous coefficient with the acquired average coefficient; and using the generated correction coefficient to correct the burst distortion occurring in the burst signal.

* * * * *